(12) United States Patent
Jiang et al.

(10) Patent No.: US 11,684,981 B2
(45) Date of Patent: Jun. 27, 2023

(54) ULTRA-FINE NANOCRYSTALLINE DIAMOND PRECISION CUTTING TOOL AND MANUFACTURING METHOD THEREFOR

(71) Applicant: NINGBO INSTITUTE OF MATERIALS TECHNOLOGY & ENGINEERING, CHINESE ACADEMY OF SCIENCES, Zhejiang (CN)

(72) Inventors: Nan Jiang, Zhejiang (CN); He Li, Zhejiang (CN); Bo Wang, Zhejiang (CN); Jian Yi, Zhejiang (CN); Yang Cao, Zhejiang (CN)

(73) Assignee: NINGBO INSTITUTE OF MATERIALS TECHNOLOGY & ENGINEERING. CHINESE ACADEMY OF SCIENCES, Zhejiang (CN)

( * ) Notice: Subject to any disclaimer, the term of this patent is extended or adjusted under 35 U.S.C. 154(b) by 114 days.

(21) Appl. No.: 17/043,439

(22) PCT Filed: Apr. 18, 2018

(86) PCT No.: PCT/CN2018/083522
§ 371 (c)(1),
(2) Date: Sep. 29, 2020

(87) PCT Pub. No.: WO2019/184018
PCT Pub. Date: Oct. 3, 2019

(65) Prior Publication Data
US 2021/0016364 A1   Jan. 21, 2021

(30) Foreign Application Priority Data
Mar. 29, 2018   (CN) .......................... 201810272430.7

(51) Int. Cl.
*B23B 27/20*   (2006.01)
*C23C 16/02*   (2006.01)
(Continued)

(52) U.S. Cl.
CPC .............. *B23B 27/20* (2013.01); *C23C 16/02* (2013.01); *C23C 16/271* (2013.01); *C23C 16/50* (2013.01); *C23C 16/56* (2013.01); *Y10T 428/30* (2015.01)

(58) Field of Classification Search
CPC ..................................................... B23B 27/20
(Continued)

(56) References Cited

U.S. PATENT DOCUMENTS 5,366,522 A * 11/1994 Nakamura ............ C23C 16/277
  51/293
5,660,936 A *  8/1997 Williams ................ C23C 16/01
  428/323

(Continued)

FOREIGN PATENT DOCUMENTS

CN   101294274 A   10/2008
CN   102212795 A   10/2011
(Continued)

OTHER PUBLICATIONS

Tang et al., "A comparison study of hydrogen incorporation among nanocrystalline, microcrystalline, and polycrystalline diamond films grown by chemical vapor deposition", Dec. 11, 2006, Thin Solid Films, vol. 515, pp. 3539-3546 (Year: 2006).*

(Continued)

*Primary Examiner* — Seth Dumbris
(74) *Attorney, Agent, or Firm* — Hamre, Schumann, Mueller & Larson, P.C.

(57) ABSTRACT

An ultra-fine nanocrystalline diamond precision cutting tool and a manufacturing method therefor. A diamond cutter is (Continued)

made of a thick self-supporting film of ultra-fine nanocrystalline diamond, the thick film having a thickness of 100-3000 microns, where 1 nanometer≤diamond grain size≤20 nanometers. In the manufacturing method, the growth of ultra-fine nanocrystalline diamond on a silicon substrate is accomplished by means of two steps of direct current hot cathode glow discharge chemical vapor deposition and hot filament chemical vapor deposition, then the silicon substrate is separated from the diamond to obtain a thick self-supporting film of ultra-fine nanocrystalline diamond, the thick self-supporting film of ultra-fine nanocrystalline diamond is laser cut and then welded to a cutter body, and then by means of edging, rough grinding and fine grinding, an ultra-fine nanocrystalline diamond precision cutting tool is obtained.

13 Claims, 8 Drawing Sheets

(51) Int. Cl.
　　　*C23C 16/27*　　　(2006.01)
　　　*C23C 16/50*　　　(2006.01)
　　　*C23C 16/56*　　　(2006.01)
(58) Field of Classification Search
　　　USPC .......................................................... 428/408
　　　See application file for complete search history.

(56) References Cited

U.S. PATENT DOCUMENTS

| | | | | |
|---|---|---|---|---|
| 2003/0152700 | A1* | 8/2003 | Asmussen | C23C 16/0254 427/249.8 |
| 2006/0216515 | A1* | 9/2006 | Kazahaya | C23C 16/0218 428/408 |
| 2009/0022969 | A1* | 1/2009 | Zhang | C23C 30/005 428/216 |
| 2010/0083583 | A1* | 4/2010 | Sumiya | B82Y 30/00 51/307 |
| 2012/0056199 | A1* | 3/2012 | Rosiwal | C04B 37/028 257/77 |
| 2014/0026492 | A1* | 1/2014 | Tatsumi | C04B 35/52 51/307 |
| 2015/0321317 | A1* | 11/2015 | Ishida | B24D 18/0009 51/307 |
| 2016/0250691 | A1* | 9/2016 | McClymont | C23C 16/01 29/557 |
| 2017/0043406 | A1* | 2/2017 | Waki | B23B 51/02 |
| 2018/0001391 | A1* | 1/2018 | Sumiya | C04B 35/645 |
| 2018/0079010 | A1* | 3/2018 | Ishida | C04B 35/52 |

FOREIGN PATENT DOCUMENTS

| | | |
|---|---|---|
| CN | 102615490 | 8/2012 |
| CN | 105603386 | 5/2016 |
| CN | 107326339 A | 11/2017 |
| EP | 0459425 A1 | 12/1991 |
| JP | 2012-176471 | * 9/2013 |

OTHER PUBLICATIONS

Askari et al., "Growth of polycrystalline and nanocrystalline diamond films on pure titanium by microwave plasma assisted CVD process", Jun. 9, 2007, Materials Research Bulletin, vol. 43, pp. 1086-1092 (Year: 2007).*

Villalpando et al., "Deposition of polycrystalline and nanocrystalline diamond on graphite: effects of surface pre-treatments", Feb. 22, 2017, Applied Physics A, vol. 123:183 (Year: 2017).*

International Search Report (in English and Chinese) and Written Opinion published in PCT/CN2018/083522, dated Jan. 4, 2019, 9 pages provided.

Office Action issued in corresponding Chinese Application No. CN201810272430 7, dated Jan. 18, 2021, with English machine translation, 10 pages provided.

Office Action issued in corresponding Chinese Application No. 201810272430.7, dated Aug. 18, 2021, with machine translation; 14 pages provided.

* cited by examiner

ULTRA-FINE NANOCRYSTALLINE DIAMOND PRECISION CUTTING TOOL AND MANUFACTURING METHOD THEREFOR

TECHNICAL FIELD

The invention relates to an ultra-fine nanocrystalline diamond precision cutting tool and manufacturing method therefor, and belongs to the diamond precision cutting tool manufacturing field.

BACKGROUND ART

Due to the special crystal structure and bonding pattern, diamond has many excellent properties such as high hardness, wear resistance, corrosion resistance, high melting point, and excellent physical and chemical stability. Diamond precision cutting tools have a wide range of applications in the field of non-ferrous metals, high-hardness non-metals and other difficult-to-process materials, and can directly produce super smooth processed surface.

At present, there are two common diamond precision cutting tools, namely single crystal diamond cutting tool and polycrystalline diamond cutting tool. Single crystal diamond cutting tool is an ideal precision machining cutting tool and has high hardness and strength, high thermal conductivity, wear resistance, low coefficient of friction with non-ferrous metals and non-metals, and good anti-adhesion performance. However, single crystal diamond has the shortcomings of anisotropy. Among them, the surface (110) has the highest strength and the best wear resistance. Considering the micro-strength, wear resistance and friction coefficient, the surface (110) is most suitable for the rack and flank faces of the cutting tool. Because the surface (110) has high strength and wear resistance, and the cutter edging in the tool manufacturing process is also very difficult, the surface (100), which has good processing performance and is relatively easy to edging, is often selected as the rack and flank faces of the cutting tool in actual applications. The process of selecting the correct crystal face to manufacture diamond cutting tool also requires experienced operators and professional equipments and increases the manufacturing process of single crystal diamond cutting tool. In addition, during the cutting process of single crystal diamond cutting tool, when the shear stress on the surface (111) exceeds a certain critical stress, two adjacent surfaces (111) will undergo cleavage and splitting, causing the single crystal diamond to burst and fail. In summary, the anisotropy of single crystal diamond limits its maximum cutting performance and use performance. Polycrystalline diamond is isotropic and can avoid problems caused by anisotropy. However, the hardness and wear resistance of polycrystalline diamond are not as good as those of single crystal diamond, and the crystal grains of polycrystalline diamond are relatively large, it is difficult to grind super smooth face and sharp cutting edge. In the cutting process of polycrystalline diamond cutting tool, if the cutting force is too large, the crystal grains will fall off, and cause the cutting tool to fail. Therefore, polycrystalline diamond also has many defects in the manufacture of diamond precision cutting tools.

Therefore, it is very important to develop new diamond material to manufacture diamond precision cutting tool, thereby avoiding the shortcomings of single crystal diamond and polycrystalline diamond and improving the performance of diamond precision cutting tool.

SUMMARY OF THE INVENTION

The object of the present invention is to provide an ultra-fine nanocrystalline diamond precision cutting tool.

In the first aspect of the present invention, it provides an ultra-fine nanocrystalline diamond cutting tool comprising a handle and a diamond cutter, wherein the diamond cutter is made of a self-supporting ultra-fine nanocrystalline diamond thick film which has a thickness of 100-3000 μm and a diamond grain size of 1 nm≤diamond grain size≤20 nm.

In another preferred embodiment, the thick film has a diameter of 50-100 mm.

In another preferred embodiment, the surface of the thick film is smooth.

In another preferred embodiment, in the thick film, the diamond grain size is nm and 16 nm.

In another preferred embodiment, the thickness of the thick film is 200-1000 μm.

The diamond precision cutting tool of the present invention is prepared by processing an ultra-fine nanocrystalline diamond thick film. Due to the isotropy of ultrafine nanocrystalline diamond, there is no need to select a specific crystal face for edging during tool processing, thereby reducing the processing difficulty. Compared with ordinary polycrystalline diamond, the grain size of ultra-fine nanocrystals is below 20 nm, and can produce very sharp cutting edges. In addition, ultra-fine nanocrystalline diamond has not only high hardness, but also strong toughness, and it is not prone to chipping during use.

In the second aspect of the present invention, it provides a method for preparing the ultra-fine nanocrystalline diamond cutting tool according to the first aspect, wherein the ultra-fine nanocrystalline diamond thick film is deposited through two steps of direct current hot cathode glow discharge chemical vapor deposition and hot filament chemical vapor deposition, and then processed into a cutting tool.

The preparation method of the present invention includes the following steps:

(i) growing an ultra-fine nanocrystalline diamond layer with a thickness of 5 to 200 μm on a surface of a silicon wafer by direct current hot cathode glow discharge chemical vapor deposition;

(ii) growing ultra-fine nanocrystalline diamond on the ultra-fine nanocrystalline diamond layer by hot filament chemical vapor deposition to obtain an ultra-fine nanocrystalline diamond thick film;

(iii) separating the ultra-fine nanocrystalline diamond thick film from the silicon wafer from, thereby obtaining a self-supporting ultra-fine nanocrystalline diamond thick film;

(iv) cutting the self-supporting ultra-fine nanocrystalline diamond thick film into a blade shape, welding it to a handle, and then edging, coarsely grinding, and finely grinding, thereby obtaining an ultra-fine nanocrystalline diamond cutting tool.

In another preferred embodiment, the silicon wafer is one that has been ground by ultra-fine nanocrystalline diamond powder. In another preferred embodiment, the particle size of the ultra-fine nanocrystalline diamond powder is 5-15 nm.

In another preferred embodiment, the preparation method further includes a step of nucleating treatment of the silicon wafer before step i).

In another preferred embodiment, the nucleation treatment is carried out in hydrogen and methane, the flow rate of hydrogen is 200-800 sccm, the concentration of methane is 4.0-7.0%, the working pressure is 2.5-5.0 kPa, the nucleation temperature is 700-800° C., and the nucleation time 20-40 min.

In another preferred embodiment, in step i), the growth atmosphere is hydrogen, methane and inert gas. In another preferred embodiment, the inert gas is nitrogen or argon. In another preferred embodiment, the flow rate of hydrogen is 200-800 sccm, the concentration of methane is 1.5-4.0%, and the concentration of inert gas is 10-60%. In another preferred embodiment, in step i), the flow rate of hydrogen is 300-700 sccm, and preferably, the flow rate of hydrogen is 400-600 sccm.

In another preferred embodiment, in step i), the growth pressure is 2-5 kPa, the growth temperature is 750-850° C., the distance between cathode and anode is 50-75 mm, and the growth time is 2-80 hours.

In another preferred embodiment, in step ii), the growth atmosphere is hydrogen, methane and inert gas. In another preferred embodiment, the inert gas is nitrogen or argon. In another preferred embodiment, the flow rate of hydrogen is 200-800 sccm, the concentration of methane is 2-6%, and the concentration of inert gas is 10-20%. In another preferred embodiment, the flow rate of hydrogen is 300-700 sccm, and preferably the flow rate of hydrogen is 400-600 sccm.

In another preferred embodiment, in step ii), the growth pressure is 1.5-2.5 kPa, and the growth time is 30-1000 hours.

In another preferred embodiment, in step ii), the hot filament is 3-20 tantalum wires with a diameter of 0.1-0.6 mm, the distance between the hot filament and the sample is 13-15 mm, and the power of each tantalum wire is 0.8-1.2 kW.

In another preferred embodiment, the hot filament is one that is carbonized in a mixed gas of hydrogen and methane. In another preferred embodiment, the carbonization pressure is 2-3 kPa, the flow rate of hydrogen is 200-800 sccm, the concentration of methane is 2-6%, and the carbonization time is 10-30 min.

In another preferred embodiment, in step iii), the silicon wafer is etched and completely dissolved in a mixture of hydrofluoric acid and nitric acid, thereby obtaining the self-supporting ultra-fine nanocrystalline diamond thick film.

In another preferred example, step iv) has one or more of the following features:

(1) cutting the self-supporting ultra-fine nanocrystalline diamond thick film with laser;

(2) welding by using copper-silver alloy brazing method;

(3) grinding a flank face and edging the diamond cutting tool on the computer numerical control machine tool for plane grinding of the diamond;

(4) coarsely grinding on an electroplated cast iron disc, and finely grinding on a cast iron disc coated with ultra-fine diamond powder to make a contour accuracy of the cutting tool below 50 nm.

The invention provides a simple and effective two-step chemical vapor deposition method for preparing ultrafine nanocrystalline diamond thick film on a silicon substrate, wherein the thick film has high hardness, strong toughness, isotropy and an extremely smooth surface. It overcomes a series of problems of grinding, polishing and anisotropy in the application of diamond materials.

The self-supporting diamond ultra-fine nanocrystalline diamond thick film has not only high hardness, but also very good toughness. It is an ideal material for manufacturing ultra-precision machining tools. Compared with single crystal diamond, nanocrystalline diamond thick film overcomes the shortcomings of anisotropy, is more suitable for manufacturing ultra-precision machining tools, and is not prone to chipping. In addition, the surface of the self-supporting ultrafine nanocrystalline diamond thick film is extremely smooth, and it can be applied to mechanical processing, dynamic sealing and other fields without mechanical polishing, thereby solving the problem of diamond grinding and polishing.

It is to be understood that above each technical feature and each technical feature specifically described hereinafter (as in the examples) within the scope of the present invention may be combined with each other to constitute a new or preferred technical solution. Each feature disclosed in the specification can be replaced by any alternative feature that provides the same, equal or similar purpose. Due to space limitations, those will not be redundantly repeated herein.

DETAILED DESCRIPTION

Figure 1:
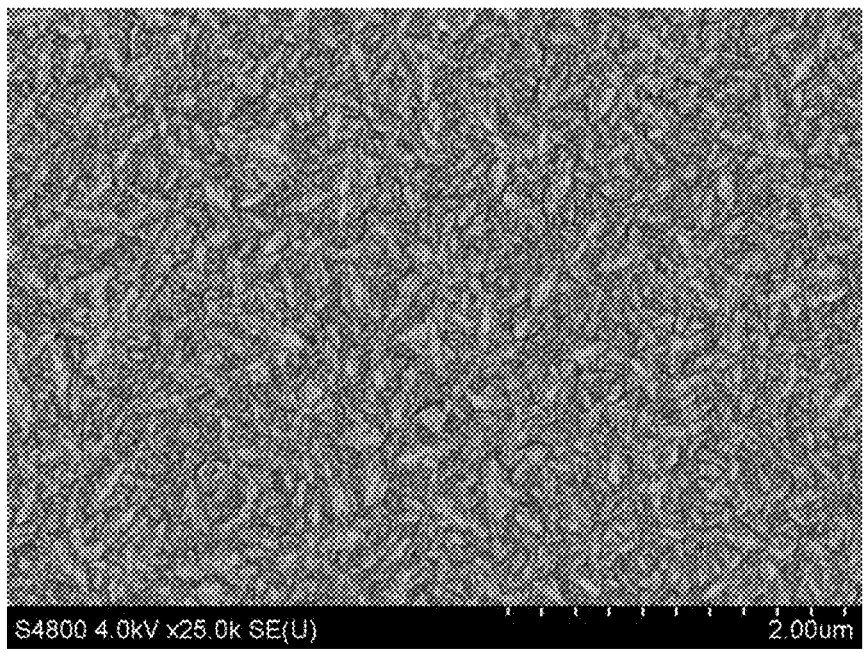
FIG. 1 is a scanning electron micrograph of the plan of the ultra-fine nanocrystalline diamond thick film obtained in Example 1.

The inventors of the present application have conducted extensive and intensive research and have developed an ultra-fine nanocrystalline diamond precision cutting tool for the first time. The ultra-fine nanocrystalline diamond precision cutting tool is manufactured by cutting a self-supporting ultra-fine nanocrystalline diamond thick film having a diameter of 50-100 mm, a thickness of 100-3000 um, and 1 nm≤grain size≤20 nm with laser, welding it to a handle, and then edging, coarsely grinding, and finely grinding. On this basis, the present invention has been completed.

Preparation Method

The present invention uses a chemical vapor deposition method to grow ultra-fine nanocrystalline diamond on a silicon wafer, and then separates the diamond from the silicon wafer to obtain a self-supporting ultrafine nanocrystalline diamond thick film. The ultrafine nanocrystalline diamond thick film has a diameter of 50-100 mm, a thickness of 100-3000 um, and a grain size of 1 nm≤grain size≤20 nm. The grown ultra-fine nanocrystalline diamond thick film is cut with laser, welded to a handle, and then edged on the Coborn PG4 computer numerical control machine tool for plane grinding of the diamond. Finally, the diamond cutting tool is coarsely ground and finely ground on a cast iron disc, thereby finishing the manufacture of ultrafine nanocrystalline diamond precision cutting tool.

The diamond grown by direct current hot cathode chemical vapor deposition has good quality and strong bonding force to the substrate, and it is not easy to separate. However, if the growth time is too long, carbon deposit at the cathode will occur, while hot filament chemical vapor deposition can grow diamond for a long time. Therefore, the chemical vapor deposition of ultra-fine nanocrystalline diamond thick film is divided into two stages.

The first stage is completed in a direct current hot cathode glow discharge chemical vapor deposition (DCCVD) equipment. A layer of ultra-fine nanocrystalline diamond with a thickness of 5 to 200 μm is grown on the surface of a silicon wafer, and the growth time is 2-80 hours.

The diamond grown by DCCVD has high purity and good quality. The stress between the grown diamond film and the silicon wafer is small, the bonding force is large, and it is not easy to crack.

In order to prevent the diamond film from bending or falling off due to stress, a thicker silicon substrate (silicon wafer) with a thickness of 500-3000 μm is used. Before diamond growth, the silicon wafer must be ground with nano-diamond powder. The silicon wafer is washed with deionized water, and then ultrasonicated in alcohol containing nano-diamond powder to increase the nucleation density of diamond. The ultrasonicated silicon substrate is washed with deionized water, dried with nitrogen gas and then subjected to chemical vapor deposition.

The gas atmosphere for diamond growth is hydrogen, methane and inert gases (nitrogen, argon, etc.). Among them, methane is the gas carbon source for diamond growth, hydrogen can etch away the graphite phase produced during the diamond deposition process, and inert gas is used to reduce the grain size of diamond growth. The methane is ionized to produce carbon-containing groups under the action of the energy generated by the direct current discharge, and the diamond is deposited on the silicon substrate, but the graphite phase is also generated at the same time. The hydrogen plasma is used to etch the graphite, thereby leaving the diamond. When hydrogen plasma etches the graphite phase, it also etches diamond, but the etch rate for graphite is much higher than that for diamond (about 50 times), so diamond can grow in a hydrogen-rich atmosphere. DCCVD uses the energy generated by direct current discharge to ionize the gas into plasma. The carbon-containing groups in the plasma are deposited on the silicon substrate by diffusion and adsorption. After dehydrogenation, the $sp^3$ phase diamond is formed, and the deposited graphite is etched by using the hydrogen plasma to form a diamond film. Inert gases such as nitrogen, argon and the like can inhibit the growth of diamond grains and promote the continuous secondary nucleation of diamonds, thereby forming ultra-fine nanocrystalline diamond film.

The second stage growth of ultra-fine nanocrystalline diamond thick film is finished in hot filament chemical vapor deposition (HFCVD) equipment. Although the diamond grown by DCCVD has few impurities and high quality, carbon deposits at the cathode occur during the long-term growth process, and the glow discharge cannot be performed stably. The long-term growth of diamond can be performed by HFCVD, so that the second stage of growth of ultra-fine nanocrystalline diamond thick film is carried out through HFCVD.

The gas conditions for growth and deposition principles of HFCVD are basically the same as those of DCCVD. However, the plasma in HFCVD is excited by the heat generated by the hot filament, so that carbon deposition will not occur, and the diamond film can be grown for a long time. After the silicon wafer is subjected to DCCVD growth, it also needs to be cleaned with deionized water and dried with nitrogen. The gas atmosphere in the HFCVD growth process is the same as that of DCCVD, which is a mixture of hydrogen, methane and inert gas. The hot filament used in HFCVD is tantalum wire. Before growth, the tantalum wire is carbonized in the mixed gas of hydrogen and methane to form a layer of tantalum carbide on the surface, thereby improving the stability and service life of the tantalum wire Then the chemical vapor deposition starts. The growth time is 30-1000 hours, and the thickness of the ultra-fine nanocrystalline diamond film is 100-3000 μm.

The ultra-fine nanocrystalline diamond thick film prepared after two-stage chemical vapor deposition needs to be separated from the silicon substrate by etching away the silicon substrate thereby obtaining a self-supporting ultrafine nanocrystalline diamond thick film. The etching solution is a mixture of hydrofluoric acid and nitric acid. The silicon wafer can be chemically reacted with hydrofluoric acid to dissolve the silicon wafer, but the speed is very slow. After nitric acid is added, the chemical reaction can proceed violently, forming $H_2SiF_6$, thereby quickly etching away the silicon substrate. Because the chemical properties of diamond are very stable, it will not react with the mixture of hydrofluoric acid and nitric acid. Therefore, after the silicon substrate is completely etched away, a self-supporting ultrafine nanocrystalline diamond thick film is successfully obtained.

After the growth is completed, the ultrafine nanocrystalline diamond thick film is cut into specific shapes and sizes for manufacturing tool by means of laser cutting. Then the diamond blade is welded to a stainless steel handle by using a copper-silver alloy powder brazing method.

The edging of the diamond cutting tool is finished on the Coborn PG4 computer numerical control machine tool for plane grinding of the diamond. The cutting edge is formed by grinding the flank face of the diamond cutting tool. The machine tool is equipped with an air spindle, which has high rigidity and feed accuracy. The whole grinding stage is divided into two stages including rough grinding and fine grinding. The grinding disc is a metal-bonded diamond grinding wheel, and the grinding of the diamond cutting tool is completed under the monitoring of a CCD camera.

The edged diamond cutting tool is ground on a cast iron plate. The grinding is divided into two stages including rough grinding and fine grinding. By grinding the rack and flank faces of the diamond cutting tool, the contour accuracy of the cutting edge is improved, and the super fine grinding diamond cutting tool is manufactured. The rough grinding of diamond cutting tool is operated by using an electroplated cast iron disc, which can quickly improve the accuracy of the cutting edge. Then the diamond cutting tool roughly ground by electroplated cast iron discs is finely ground on the cast iron disc coated with ultrafine diamond powder to make the cutting edge contour accuracy below 50 nm, thereby completing the manufacture of ultra-fine nanocrystalline diamond precision grinding tool.

The advantages of the present invention are that the ultrafine nanocrystalline diamond thick film is prepared by two-step chemical vapor deposition, and then welded to a handle by laser cutting, and then sharpened, coarsely ground, and finely ground to manufacture the ultrafine nanocrystalline diamond precision cutting tool. The ultra-fine nanocrystalline diamond thick film not only has high strength and strong toughness, but also overcomes the shortcomings of anisotropy. It is an ideal manufacturing material for diamond precision cutting tool. It solves the problem of the selection of the edging surface in the diamond cutting tool manufacturing process, and a very sharp cutting edge can be sharpened, and it is not easy to chip in the cutting process.

The present invention will be further explained below in conjunction with specific examples. It should be understood that these examples are only used to illustrate the present invention and not to limit the scope of the present invention. The experimental methods without specific conditions in the following examples are usually in accordance with conventional conditions or in accordance with the conditions recommended by the manufacturer. Unless otherwise specified, percentages and parts are percentages by weight and parts by weight.

Unless otherwise defined, all professional and scientific terms used herein have the same meanings as those familiar to those skilled in the art. In addition, any methods and materials similar or equivalent to the content described can be applied to the method of the present invention. The preferred embodiments and materials described herein are for demonstration purpose only.

Example 1

A silicon (100) surface with a diameter of 50-100 mm and a thickness of 500-3000 μm was used for chemical vapor deposition of ultra-fine nanocrystalline diamond thick film. Before being deposited, in order to increase the nucleation density of diamond to grow ultra-fine nanocrystalline diamond, the silicon wafer was ground with ultra-fine nanocrystalline diamond powder to form many nanogrooves on the surface of the silicon wafer to promote diamond nucleation. The ultra-fine nanocrystalline diamond powder had a particle size of 5-15 nm, and the silicon wafer was ground by hand grinding. The ground silicon wafer was ultrasonically cleaned with deionized water, then it was subjected to ultrasonic treatment in an alcohol suspension containing ultra-fine nanocrystalline diamond powder, and seeding was performed on the surface of the silicon. The ultrasound time was 5-30 min. High density ultra-fine nanocrystalline diamond powder was remained on the surface of the silicon wafer ultrasonicated in the diamond powder suspension, and was used as the initial nucleation point for diamond chemical vapor deposition. The residual alcohol on the silicon substrate after seeding was dried with nitrogen before depositing the diamond film, otherwise it would affect the vacuum of the chemical vapor deposition equipment.

The first stage of diamond film growth was carried out in DCCVD with a maximum power of 45 kW. The gas atmosphere for diamond growth was hydrogen, methane and inert gases (nitrogen, argon, etc.). The purity of hydrogen was 99.9%, the purity of methane was 99.99%, and the purity of inert gas was 99.9%. The nucleation treatment was performed before the diamond was growth. The nucleation was carried out in a mixed gas of hydrogen and methane, the flow rate of hydrogen was 400-800 sccm, the concentration of methane was 4.0-7.0%, the working pressure was 2.5-5.0 kPa, the nucleation temperature was 700-800° C., and the nucleation time was 20-40 min. After the nucleation was completed, diamond growth was performed. The process parameters of the growth process were different from those of the nucleation process. The growth process was carried out in a mixed gas of hydrogen, methane and inert gas. The flow rate of hydrogen was 600 sccm (standard cubic centimeters per minute), the concentration of methane was 1.5-4.0%, and the concentration of inert gas was 10-60%. The growth pressure was 2-5 kPa, the growth temperature was 750-850° C., the distance between anode and cathode was 50-75 mm, the growth time was 2-80 hours, and the thickness of the ultra-fine nanocrystalline diamond film was 5-200 μm.

The second stage of diamond film growth was carried out in HFCVD. The ultra-fine nanocrystalline diamond film grown in DCCVD was washed with deionized water and dried with nitrogen, and then placed in HFCVD to grow in thickness. The hot filament for growth by HFCVD was 3-20 tantalum wires with a diameter of 0.1-0.6 mm. The distance between the hot filament and the sample was 13-15 mm, and the power of each tantalum wire was 0.8-1.2 kW. Before growth, the tantalum wires were first carbonized in a mixed gas of hydrogen and methane to improve the stability and service life thereof. The carbonization pressure was 2 kPa, the flow rate of hydrogen was 400 sccm, the concentration of methane was 2%, and the carbonization time was 10-30 min. After the carbonization was completed, the growth of the diamond film was carried out. The growth pressure was reduced to 1.5 kPa, and 10% inert gas was introduced. The growth time was 30-1000 hours, and the thickness of the ultra-fine nanocrystalline diamond film was 100-3000 μm.

After the growth was completed, the ultra-fine nanocrystalline diamond thick film was separated from the silicon substrate by etching away the silicon substrate, thereby obtaining a self-supporting ultra-fine nanocrystalline diamond thick film. The etching solution was a mixture of hydrofluoric acid and nitric acid with a volume ratio of 3:1. The silicon wafer was dissolved by the chemical reaction of $3Si+4HNO_3+18HF=3H_2SiF_6+4NO+8H_2O$. During the reaction process, NO gas was generated during the reaction, so the erosion was carried out in a fume hood. In addition, a large amount of reaction heat was generated during the reaction, and the reaction speed must be controlled to prevent the ultra-fine nanocrystalline diamond thick film from cracking due to heat. Therefore, the etching process was carried out step by step. According to the size of the diamond thick film, the silicon wafer was completely dissolved by adding an etching solution 3 to 5 times.

The prepared ultra-fine nanocrystalline diamond thick film was tested and characterized by scanning electron microscopy, transmission electron microscopy, and Raman spectra.

Figure 2:
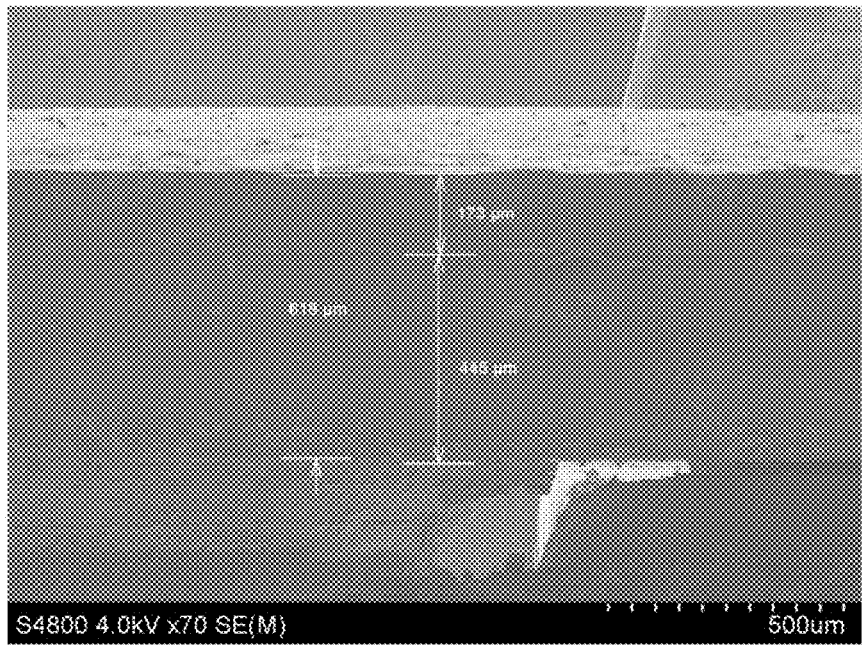
FIG. 2 is a scanning electron micrograph of the cross-section of the ultra-fine nanocrystalline diamond thick film obtained in Example 1.

FIG. 1 is a scanning electron micrograph of the plan of the ultra-fine nanocrystalline diamond thick film. It can be seen from FIG. 1 that the diamond grains are ultra-fine nanocrystals, distributed in needle-like clusters. FIG. 2 is a scanning electron micrograph of the cross-section of the ultra-fine nanocrystalline diamond thick film. It can be seen from FIG. 2 that the thick diamond film is divided into two layers with a total thickness of 618 μm, wherein the thickness of the nucleation layer is 173 μm and the thickness of the growth layer is 445 μm.

Figure 3:
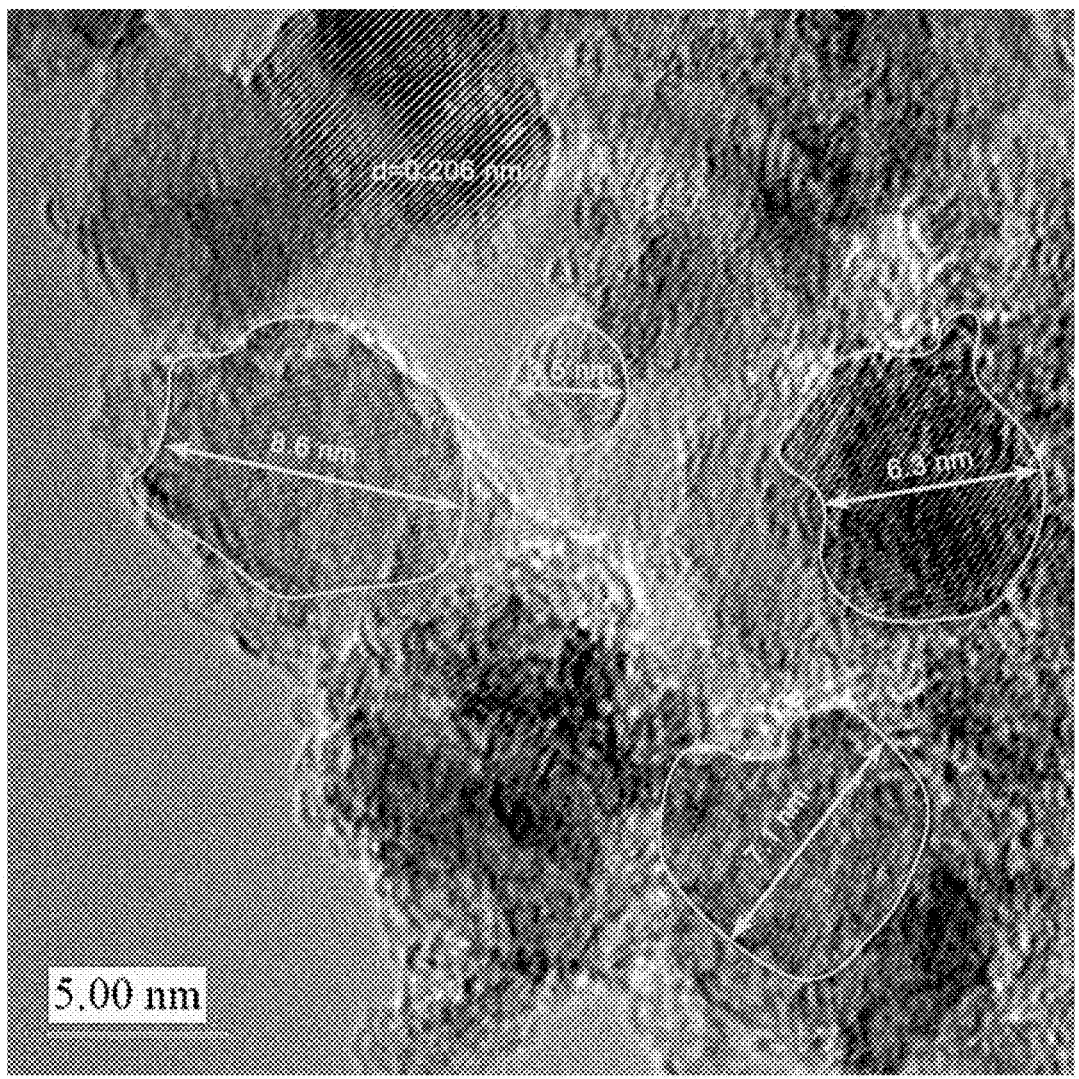
FIG. 3 is a high-resolution transmission electron micrograph of the cross-section of the ultra-fine nanocrystalline diamond thick film obtained in Example 1.

FIG. 3 is a high-resolution transmission electron micrograph of the cross-section of the ultra-fine nanocrystalline diamond thick film. It can be seen from FIG. 3 that the prepared thick diamond film is ultra-fine nanocrystalline diamond, and the sizes of the four crystal grains marked in the figure are 3.5 nm, 6.3 nm, 7.1 nm, and 8.6 nm, respectively.

Figure 4:
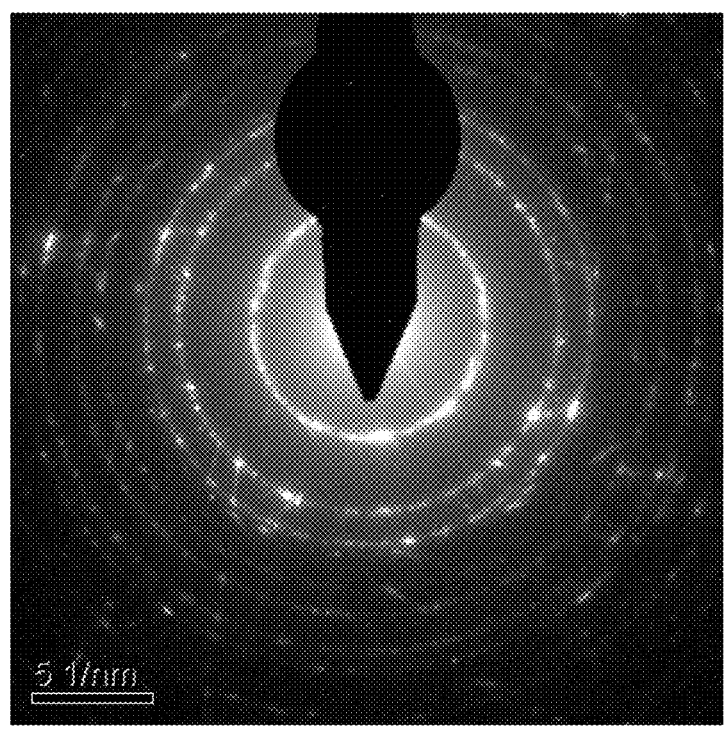
FIG. 4 is an electron diffraction photograph of the selected cross-section area of the ultra-fine nanocrystalline diamond thick film obtained in Example 1.

FIG. 4 is an electron diffraction photograph of the selected cross-section area of the ultra-fine nanocrystalline diamond thick film. It can be seen from FIG. 4 that the diffraction points on the diffraction rings of diamonds at various levels are densely arranged. It is a typical electron diffraction image of nanocrystalline diamond.

Figure 5:
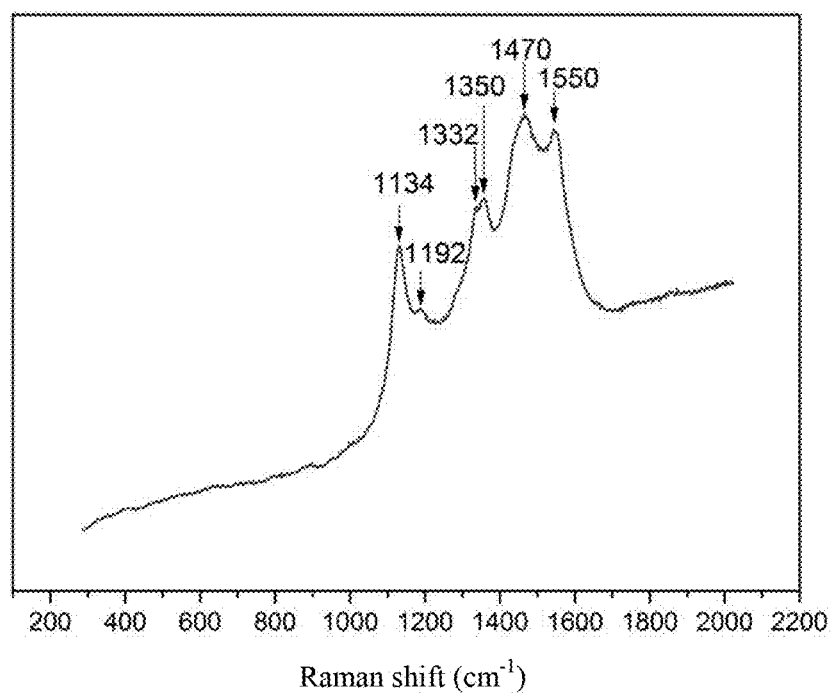
FIG. 5 is a Raman spectrum diagram of the ultra-fine nanocrystalline diamond thick film obtained in Example 1.

FIG. 5 is a Raman spectrum diagram of the ultra-fine nanocrystalline diamond thick film. It can be seen from FIG. 5 that there are 6 Raman peaks of the thick diamond film, which are located at 1134, 1192, 1332, 1350, 1470, and 1550 $cm^{-1}$. It is a typical Raman spectra of nanocrystalline diamond.

Figure 6:
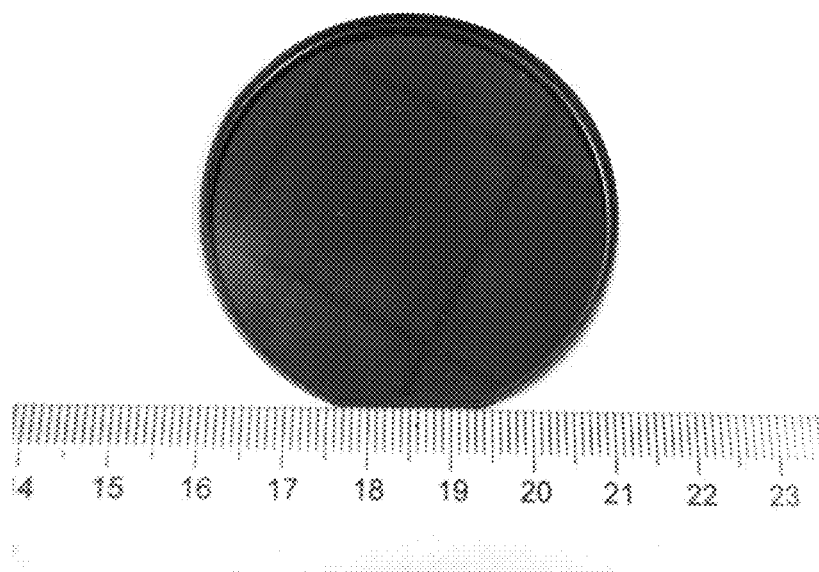
FIG. 6 is an optical photograph of the ultra-fine nanocrystalline diamond thick film obtained in Example 1.

FIG. 6 is an optical photograph of the ultra-fine nanocrystalline diamond thick film. It can be seen from FIG. 6 that the diameter of the diamond thick film is 50 mm, and the surface is mirror-like and extremely smooth.

Figure 7:
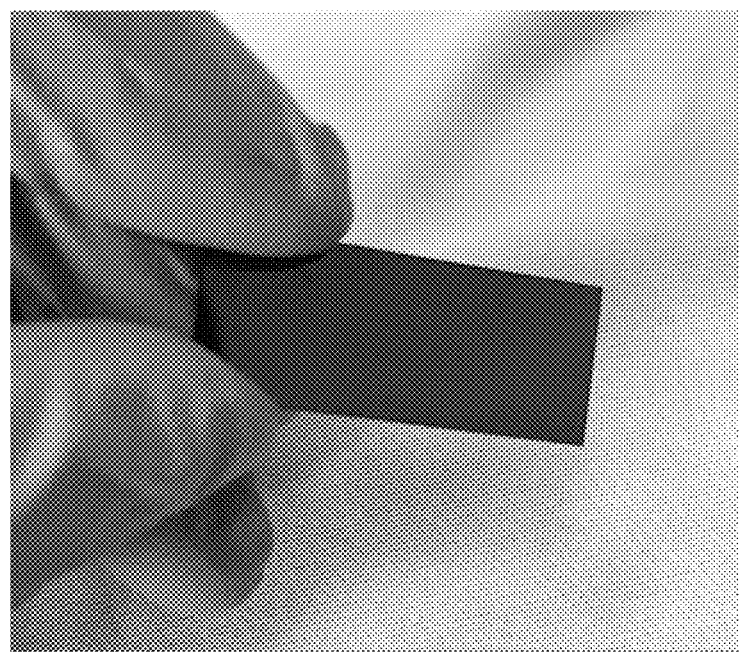
FIG. 7 is an optical photograph of the ultra-fine nanocrystalline diamond thick film after cutting obtained in Example 1.

FIG. 7 is an optical photograph of the ultra-fine nanocrystalline diamond thick film after cutting. It can be seen from FIG. 7 that the diamond thick film after cutting is square with a flat cut.

The ultra-fine nanocrystalline diamond thick film was cut with laser into the desired shapes and sizes for the cutting tool. The laser energy used was 4-6 W, the laser frequency was 5-6 kHz, and the feed speed was 2-5 mm/s. After cutting, the diamond blade was welded to a handle by brazing. The brazing paste was made of copper-silver alloy powder, evenly coated on the welding surface of the handle and the diamond blade, heated to 800-1000° C. to melt. After cooling, the diamond blade was welded to handle.

The edging of the diamond cutting tool was operated on the Coborn PG4 computer numerical control machine tool for plane grinding of the diamond. The cutting edge was formed by grinding the flank face of the diamond cutting tool. The grinding disc was a metal-bonded diamond grinding wheel having a diameter of 85 mm with a rotation speed of 4000-6000 rpm. The grinding was divided into two stages including rough grinding and fine grinding. The entire grinding process was completed under the monitoring of a CCD camera. The feed speed of rough grinding was 4-6 um/min, the speed of rotation with oscillation was 8-12 degrees/sec, the feed speed of fine grinding was 1-3 um/min, and the speed of rotation with oscillation was 15-20 degrees/sec.

After edging the diamond cutting tool, the cast iron disc was used for further grinding to improve the contour accuracy of the cutting edge. The grinding was divided into two stages including rough grinding and fine grinding. The rough grinding on the cast iron disc adopted an electroplated cast iron disc, the diameter of the cast iron disc was 2500-3500 mm, the rotation speed was 3000-4000 rpm, and the rack and flank faces of the diamond cutting tool were respectively ground. After rough grinding by using the cast iron disc, the diamond cutting tool was finely ground on a cast iron disc coated with ultrafine diamond powder. The diameter of the diamond powder was 5-15 nm, the diameter of the cast iron disc was also 2500-3500 mm, and the speed of the cast iron disc was 1500-2500 rpm. The rack and flank faces of the diamond cutting tool were ground in sequence, and the contour accuracy of the cutting edge were ground to be below 50 nm, thereby completing the manufacture of ultra-fine nanocrystalline diamond precision cutting tool.

Figure 8:
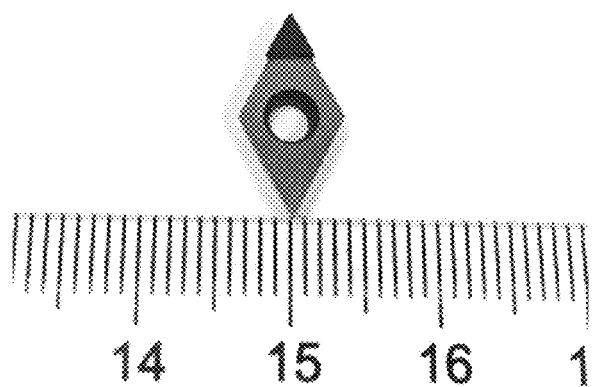
FIG. 8 is an optical photograph of the ultrafine nanocrystalline diamond precision arc-shaped cutting tool obtained in Example 1.

FIG. 8 is an optical photograph of the ultrafine nanocrystalline diamond precision arc tool obtained in Example 1.

Figure 9:
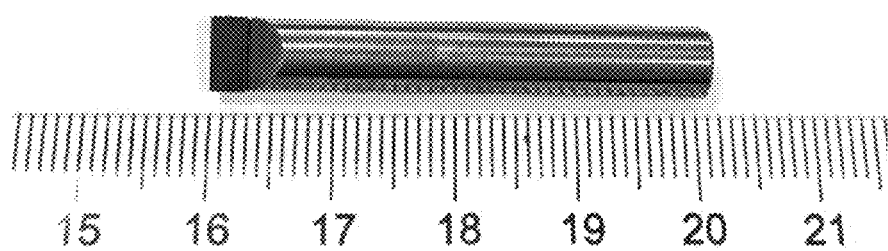
FIG. 9 is an optical photograph of the ultrafine nanocrystalline diamond precision straight edge cutting tool obtained in Example 1.

FIG. 9 is an optical photograph of the ultrafine nanocrystalline diamond precision straight edge tool obtained in Example 1.

It can be seen from FIGS. 8 and 9 that the finished cutting tools have flat and sharp cutting edges, and the rake faces are very smooth with very low roughness.

Figure 10:
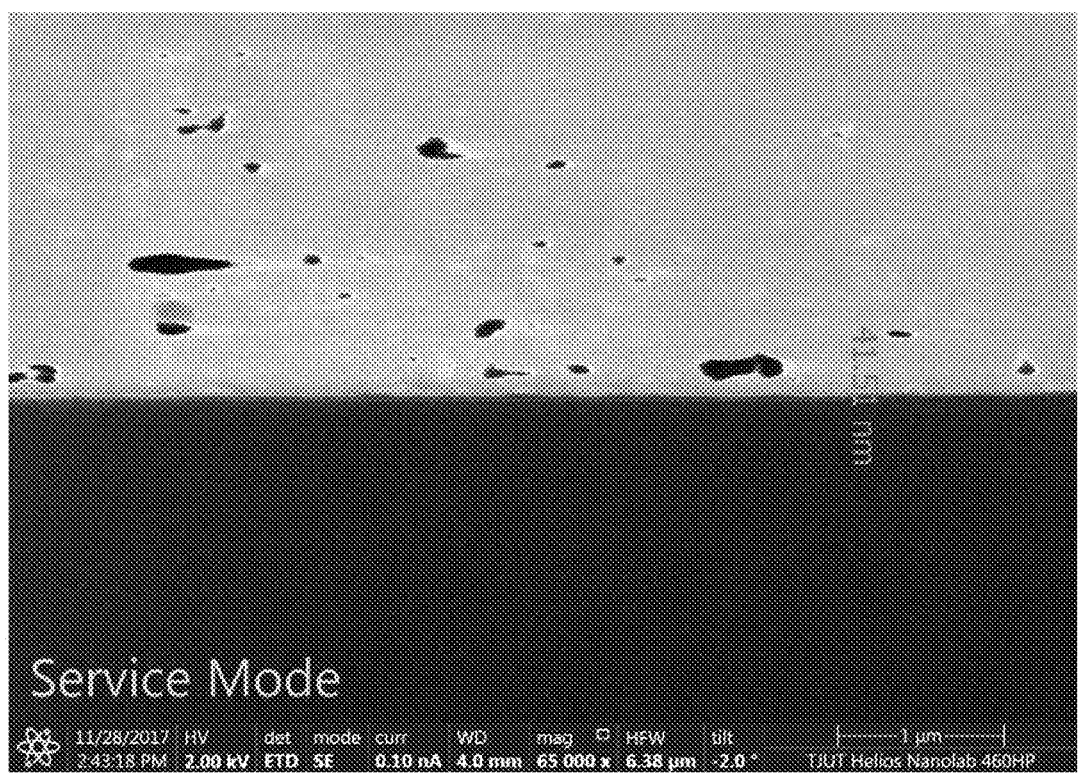
FIG. 10 is a scanning photograph of the cutting edge contour line of the ultrafine nanocrystalline diamond precision cutting tool obtained in Example 1.

FIG. 10 is a scanning photograph of the cutting edge profile of the ultrafine nanocrystalline diamond precision cutting tool obtained in Example 1.

It can be seen from FIG. 10 that the cutting edge of the cutting tool is flat and sharp, the rake face is free of defects except for a few contaminants, and the contour accuracy is 41.51 nm, which is less than 50 nm.

Example 2

A self-supporting ultra-fine nanocrystalline diamond thick film was prepared by using the method of Example 1, except that the distance between the hot filament and the sample was 14 mm, the growth pressure was 1.5 kPa, the concentration of methane was 2%, the concentration of inert gas was 10%, and the growth time of ultra-fine nanocrystalline diamond thick film was 30-1000 hours. As measured, the thickness of the thick film was 500 μm, and the average diamond grain size was 10 nm.

After cutting, welding and grinding, the manufacture of ultra-fine nanocrystalline diamond precision cutting tool was finished.

Figure 11:
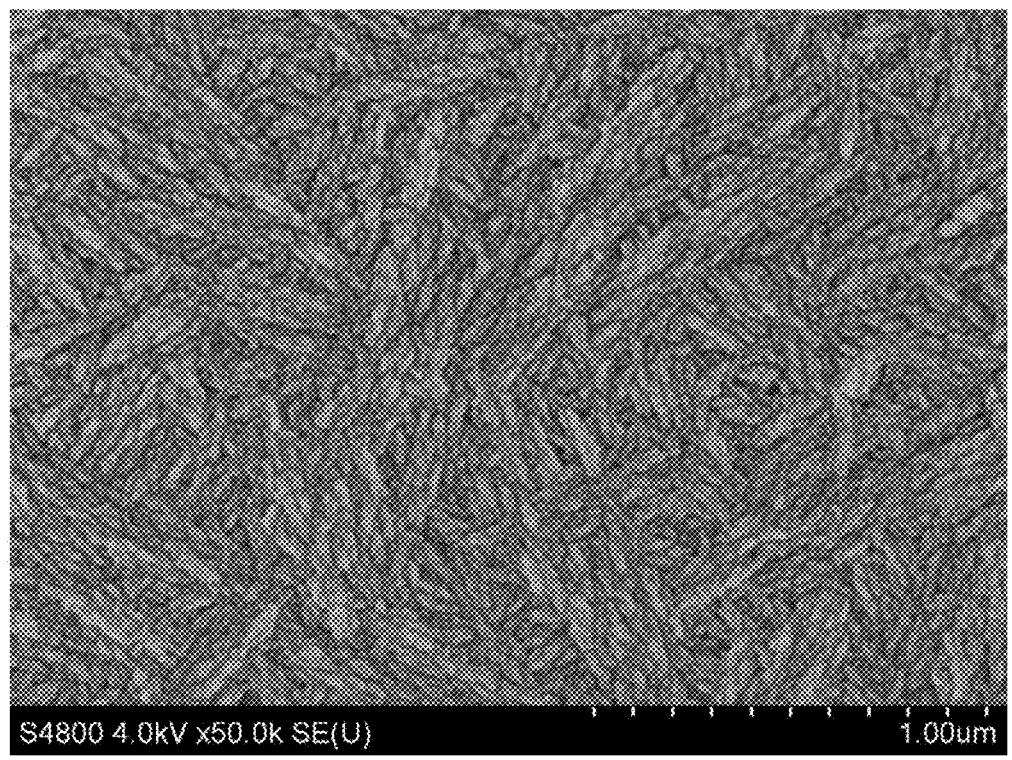
FIG. 11 is a scanning electron micrograph of the plan of the ultra-fine nanocrystalline diamond thick film obtained in Example 2.

FIG. 11 is a scanning electron micrograph of the plan of the ultra-fine nanocrystalline diamond thick film obtained in example 2. It can be seen from FIG. 11 that the crystal grains of the diamond thick film are still ultra-fine nanocrystals. Compared with Example 1, the needle-like clusters were more obvious.

Figure 12:
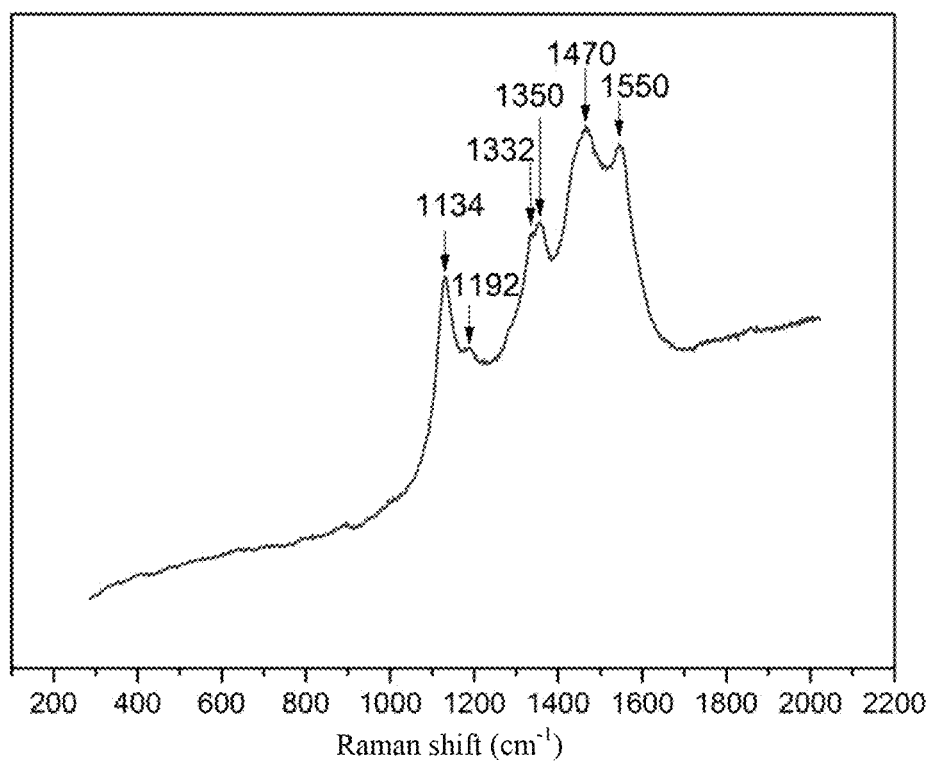
FIG. 12 is a Raman spectrum diagram of the ultra-fine nanocrystalline diamond thick film obtained in Example 2.

FIG. 12 is a Raman spectrum diagram of the ultra-fine nanocrystalline diamond thick film obtained in Example 2. It can be seen from FIG. 12 that there are 6 Raman peaks of the diamond thick film, which are located at 1134, 1192, 1332, 1350, 1470, and 1550 $cm^{-1}$. It is a typical Raman spectra of nanocrystalline diamond.

Example 3

A self-supporting ultra-fine nanocrystalline diamond thick film was prepared by using the method of Example 1, except that the distance between the hot filament and the sample was 15 mm, the growth pressure was 1.5 kPa, the concentration of methane was 2%, the concentration of inert gas was 10%, and the growth time of ultra-fine nanocrystalline diamond thick film was 30-1000 hours. As measured, the thickness of the thick film was 450 μm, and the average diamond grain size was 12 nm.

After cutting, welding and grinding, the manufacture of ultra-fine nanocrystalline diamond precision cutting tool was finished.

Figure 13:
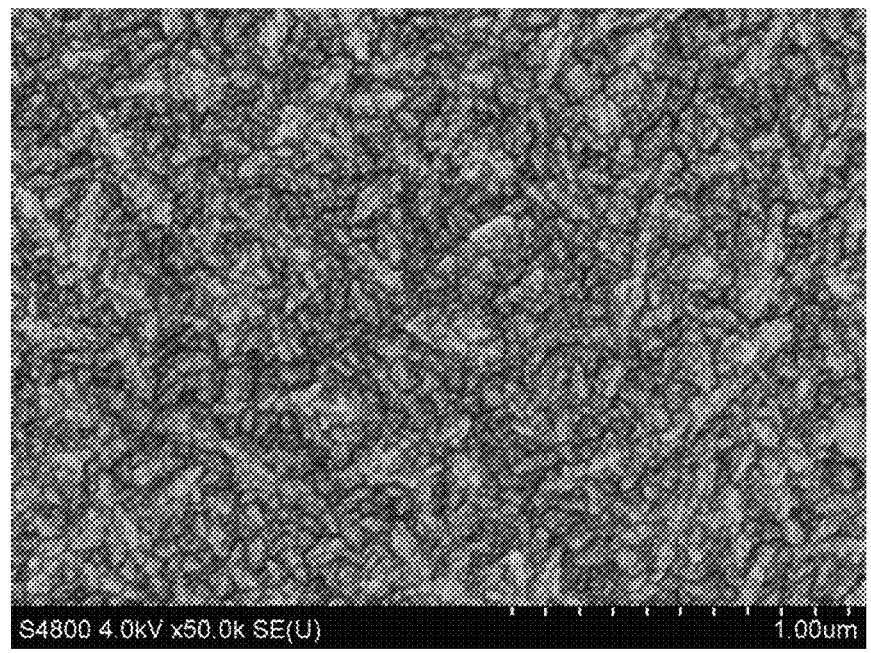
FIG. 13 is a scanning electron micrograph of the plan of the ultra-fine nanocrystalline diamond thick film obtained in Example 3.

FIG. 13 is a scanning electron micrograph of the plan of the ultra-fine nanocrystalline diamond thick film obtained in example 3. It can be seen from FIG. 13 that the crystal grains of the diamond thick film are still ultra-fine nanocrystals. Compared with Example 1, the diamond grains were no longer distributed in needle-like clusters.

Figure 14:
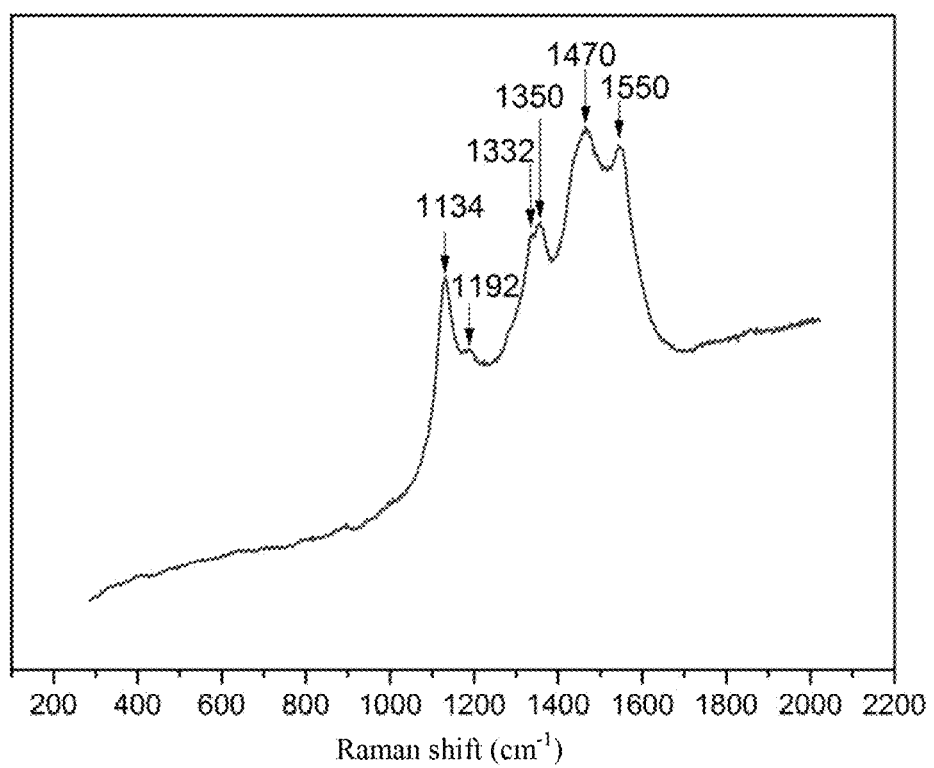
FIG. 14 is a Raman spectrum diagram of the ultra-fine nanocrystalline diamond thick film obtained in Example 3.

FIG. 14 is a Raman spectrum diagram of the ultra-fine nanocrystalline diamond thick film obtained in Example 3. It can be seen from FIG. 14 that there are 6 Raman peaks of thick diamond film, which are located at 1134, 1192, 1332, 1350, 1470, and 1550 cm$^{-1}$. It is a typical Raman spectra of nanocrystalline diamond.

Example 4

A self-supporting ultra-fine nanocrystalline diamond thick film was prepared by using the method of Example 1, except that the distance between the hot filament and the sample was 13 mm, the growth pressure was 2.0 kPa, the concentration of methane was 2%, the concentration of inert gas was 10%, and the growth time of the ultra-fine nanocrystalline diamond thick film was 30-1000 hours. As measured, the thickness of the thick film was 550 μm, and the average diamond grain size was 8 nm.

After cutting, welding and grinding, the manufacture of ultra-fine nanocrystalline diamond precision cutting tool was finished.

Example 5

A self-supporting ultra-fine nanocrystalline diamond thick film was prepared by using the method of Example 1, except that the distance between the hot filament and the sample was 13 mm, the growth pressure was 2.5 kPa, the concentration of methane was 2%, the concentration of inert gas was 10%, and the growth time of ultra-fine nanocrystalline diamond thick film was 30-1000 hours. As measured, the thickness of the thick film was 500 μm, and the average diamond grain size was 5 nm.

After cutting, welding and grinding, the manufacture of ultra-fine nanocrystalline diamond precision cutting tool was finished.

Example 6

A self-supporting ultra-fine nanocrystalline diamond thick film was prepared by using the method of Example 1, except that the distance between the hot filament and the sample was 13 mm, the growth pressure was 1.5 kPa, the concentration of methane was 4%, the concentration of inert gas was 10%, and the growth time of ultra-fine nanocrystalline diamond thick film was 30-1000 hours. As measured, the thickness of the thick film was 400 μm, and the average diamond grain size was 15 nm.

After cutting, welding and grinding, the manufacture of ultra-fine nanocrystalline diamond precision cutting tool was finished.

Example 7

A self-supporting ultra-fine nanocrystalline diamond thick film was prepared by using the method of Example 1, except that the distance between the hot filament and the sample was 13 mm, the growth pressure was 1.5 kPa, the concentration of methane was 6%, the concentration of inert gas was 10%, and the growth time of ultra-fine nanocrystalline diamond thick film was 30-1000 hours. As measured, the thickness of the thick film was 400 μm, and the average diamond grain size was 10 nm.

After cutting, welding and grinding, the manufacture of ultra-fine nanocrystalline diamond precision cutting tool was finished.

Example 8

A self-supporting ultra-fine nanocrystalline diamond thick film was prepared by using the method of Example 1, except that the distance between the hot filament and the sample was 13 mm, the growth pressure was 1.5 kPa, the concentration of methane was 6%, the concentration of inert gas was 15%, and the growth time of ultra-fine nanocrystalline diamond thick film was 30-1000 hours. As measured, the thickness of the thick film was 350 μm, and the average diamond grain size was 7 nm.

After cutting, welding and grinding, the manufacture of ultra-fine nanocrystalline diamond precision cutting tool was finished.

Example 9

A self-supporting ultra-fine nanocrystalline diamond thick film was prepared by using the method of Example 1, except that the distance between the hot filament and the sample was 13 mm, the growth pressure was 1.5 kPa, the concentration of methane was 6%, the concentration of inert gas was 20%, and the growth time of ultra-fine nanocrystalline diamond thick film was 30-1000 hours. As measured, the thickness of the thick film was 300 μm, and the average diamond grain size was 5 nm.

After cutting, welding and grinding, the manufacture of ultra-fine nanocrystalline diamond precision cutting tool was finished.

All documents mentioned in the present invention are cited as references in this application, as if each document is individually cited as a reference. In addition, it should be understood that after reading the above teaching content of the present invention, those skilled in the art can make various changes or modifications to the present invention, and these equivalent forms also fall within the scope defined by the appended claims of the present application.

The invention claimed is:

1. An ultra-fine nanocrystalline diamond cutting tool, which is composed of a handle and a diamond cutter, wherein the diamond cutter is made of a self-supporting ultra-fine nanocrystalline diamond thick film;
    wherein which the thick film has a thickness of 100-3000 μm and has a diamond grain size of 1 nm-20 nm;
    wherein, the surface of the thick film is smooth;
    wherein, the ultra-fine nanocrystalline diamond cutting tool is prepared through the following steps:
    (i) growing an ultra-fine nanocrystalline diamond layer with a thickness of 5 to 200 μm on a surface of a silicon wafer by direct current hot cathode glow discharge chemical vapor deposition;
    (ii) growing ultra-fine nanocrystalline diamond on the ultra-fine nanocrystalline diamond layer by hot filament chemical vapor deposition to obtain an ultra-fine nanocrystalline diamond thick film;
    (iii) separating the ultra-fine nanocrystalline diamond thick film from the silicon wafer, thereby obtaining the self-supporting ultra-fine nanocrystalline diamond thick film;
    (iv) cutting the self-supporting ultra-fine nanocrystalline diamond thick film into a blade shape, welding it to the handle, and then edging, coarsely grinding, and finely grinding, thereby obtaining the ultra-fine nanocrystalline diamond cutting tool.

2. A preparation method for preparing an ultra-fine nanocrystalline diamond cutting tool according to claim 1, which comprises the following steps:
    (i) growing an ultra-fine nanocrystalline diamond layer with a thickness of 5 to 200 μm on a surface of a silicon wafer by direct current hot cathode glow discharge chemical vapor deposition;
    (ii) growing ultra-fine nanocrystalline diamond on the ultra-fine nanocrystalline diamond layer by hot filament chemical vapor deposition to obtain an ultra-fine nanocrystalline diamond thick film;
    (iii) separating the ultra-fine nanocrystalline diamond thick film from the silicon wafer, thereby obtaining a self-supporting ultra-fine nanocrystalline diamond thick film;

(iv) cutting the self-supporting ultra-fine nanocrystalline diamond thick film into a blade shape, welding it to a handle, and then edging, coarsely grinding, and finely grinding, thereby obtaining an ultra-fine nanocrystalline diamond cutting tool.

3. The preparation method of claim 2, wherein the preparation method further comprises a step of nucleating the silicon wafer before step i).

4. The preparation method of claim 2, wherein, in step i), the growth atmosphere is hydrogen, methane and inert gas, the flow rate of hydrogen is 200-800 sccm, the concentration of methane is 1.5-4.0%, and the concentration of inert gas is 10-60%.

5. The preparation method of claim 2, wherein, in step i), the growth pressure is 2-5 kPa, the growth temperature is 750-850° C., the distance between cathode and anode is 50-75 mm, and the growth time is 2-80 hours.

6. The preparation method of claim 2, wherein, in step ii), the growth atmosphere is hydrogen, methane and inert gas, the flow rate of hydrogen is 200-800 sccm, the concentration of methane is 2-6%, and the concentration of inert gas is 10-20%.

7. The preparation method of claim 2, wherein, in step ii), the hot filament is 3-20 tantalum wires with a diameter of 0.1-0.6 mm, the distance between the hot filament and the sample is 13-15 mm, and the power of each tantalum wire is 0.8-1.2 kW.

8. The preparation method of claim 2, wherein, in step ii), the growth pressure is 1.5-2.5 kPa, and the growth time is 30-1000 hours.

9. The preparation method of claim 2, wherein, in step iii), a mixture of hydrofluoric acid and nitric acid is used to etch the silicon wafer to completely dissolve the silicon wafer, thereby obtaining the self-supporting ultra-fine nanocrystalline diamond thick film.

10. The preparation method of claim 2, wherein step iv) has one or more of the following features:
    (1) cutting the self-supporting ultra-fine nanocrystalline diamond thick film with laser;
    (2) welding by using copper-silver alloy brazing method;
    (3) grinding a flank face and edging the diamond cutting tool on the computer numerical control machine tool for plane grinding of the diamond;
    (4) coarsely grinding on an electroplated cast iron disc, and finely grinding on a cast iron disc coated with ultra-fine diamond powder to make a contour accuracy of the cutting edge of the cutting tool below 50 nm.

11. The ultra-fine nanocrystalline diamond cutting tool of claim 1, wherein in the thick film, the diamond grain size is 2-16 nm.

12. The ultra-fine nanocrystalline diamond cutting tool of claim 1, wherein the thickness of the thick film is 200-1000 µm.

13. The ultra-fine nanocrystalline diamond cutting tool of claim 1, wherein in the thick film, the diamond grain size is 1-8 nm.

* * * * *